(12) United States Patent
Lin et al.

(10) Patent No.: US 12,154,838 B2
(45) Date of Patent: Nov. 26, 2024

(54) SEMICONDUCTOR ARRANGEMENT AND METHOD OF FORMING

(71) Applicant: TAIWAN SEMICONDUCTOR MANUFACTURING COMPANY LIMITED, Hsin-Chu (TW)

(72) Inventors: Chih-Wei Lin, Taichung (TW); Ming-Hsien Lin, Hsinchu County (TW); Ming-Hong Hsieh, Bade (TW); Jian-Hong Lin, Yunlin (TW)

(73) Assignee: TAIWAN SEMICONDUCTOR MANUFACTURING COMPANY LIMITED, Hsin-Chu (CN)

( * ) Notice: Subject to any disclaimer, the term of this patent is extended or adjusted under 35 U.S.C. 154(b) by 432 days.

(21) Appl. No.: 17/458,735

(22) Filed: Aug. 27, 2021

(65) Prior Publication Data

US 2023/0066291 A1 Mar. 2, 2023

(51) Int. Cl.
*H01L 23/367* (2006.01)
*H01L 21/48* (2006.01)
*H01L 23/373* (2006.01)
*H01L 23/522* (2006.01)
*H01L 23/528* (2006.01)
*H01L 25/00* (2006.01)

(52) U.S. Cl.
CPC ........ *H01L 23/367* (2013.01); *H01L 21/4882* (2013.01); *H01L 23/3736* (2013.01); *H01L 23/5226* (2013.01); *H01L 23/5228* (2013.01); *H01L 23/5283* (2013.01); *H01L 23/528* (2013.01); *H01L 25/50* (2013.01)

(58) Field of Classification Search
CPC ............... H01L 23/367; H01L 21/4882; H01L 23/3736; H01L 23/5226; H01L 23/5228; H01L 23/5283; H01L 23/522; H01L 23/3677; H01L 23/528; H01L 25/50
See application file for complete search history.

(56) References Cited

U.S. PATENT DOCUMENTS

| | | | | |
|---|---|---|---|---|
| 2014/0015110 A1* | 1/2014 | Lee | ........................ | H01L 25/074 257/620 |
| 2020/0006186 A1* | 1/2020 | Pan | ........................ | H01L 25/50 |
| 2020/0126882 A1* | 4/2020 | Jang | .................... | H01L 25/0655 |
| 2020/0411507 A1* | 12/2020 | An | .......................... | H10K 59/88 |

* cited by examiner

*Primary Examiner* — Patricia D Valenzuela
(74) *Attorney, Agent, or Firm* — Cooper Legal Group, LLC (57) ABSTRACT

A semiconductor arrangement includes a heat source above an interconnect layer and below a heat conductor. The heat conductor is coupled to a heat sink by a thermally conductive bonding layer. Heat from the heat source is conducted through the heat conductor in a direction opposite the direction of the interconnect layer, through the thermally conductive bonding layer, and to a heat sink. The heat conductor includes an arrangement of dielectric layers, dummy metal layers, and dummy VIA layers.

20 Claims, 8 Drawing Sheets

SEMICONDUCTOR ARRANGEMENT AND METHOD OF FORMING

BACKGROUND

Semiconductor arrangements are used in a multitude of electronic devices, such as mobile phones, laptops, desktops, tablets, watches, gaming systems, and various other industrial, commercial, and consumer electronics. Many semiconductor arrangements include components that generate heat. Heat generating components include power supplies, power conductors, signal generators, signal conductors, resistors, and other components. Heat may impact the performance of a semiconductor arrangement.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides several different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly. Also, relationship terms such as "connected to," "adjacent to," "coupled to," and the like, may be used herein to describe both direct and indirect relationships. "Directly" connected, adjacent, or coupled may refer to a relationship in which there are no intervening components, devices, or structures. "Indirectly" connected, adjacent, or coupled may refer to a relationship in which there are intervening components, devices, or structures.

According to some embodiments, a semiconductor arrangement comprises a heat conductor coupled to a heat sink by a thermally conductive material of a bonding layer. A component layer comprising a heat source is below the heat conductor. An interconnect arrangement comprising metal layers and VIAs is below the heat source. Heat from the heat source conducts in the direction of the heat sink by way of the heat conductor and the thermally conductive material. Because the heat sink is above the heat source and the interconnect arrangement is below the heat source, the heat conductor conducts heat away from the interconnect arrangement and toward the heat sink. Because heat is conducted away from the interconnect arrangement, the interconnect arrangement is exposed to less heat than interconnect arrangements are exposed to in semiconductor arrangements that do not include a heat conductor over the heat source, a thermally conductive material of a bonding layer over the heat conductor, and a heat sink over the thermally conductive material of a bonding layer. Because the interconnect arrangement is exposed to less heat, the metal layers and VIAs of the interconnect arrangement are less likely to suffer heat damage due to heat dissipated by the heat source.

FIGS. 1-7 are illustrations of a semiconductor arrangement 100 at various stages of fabrication, according to some embodiments.

Figure 1:
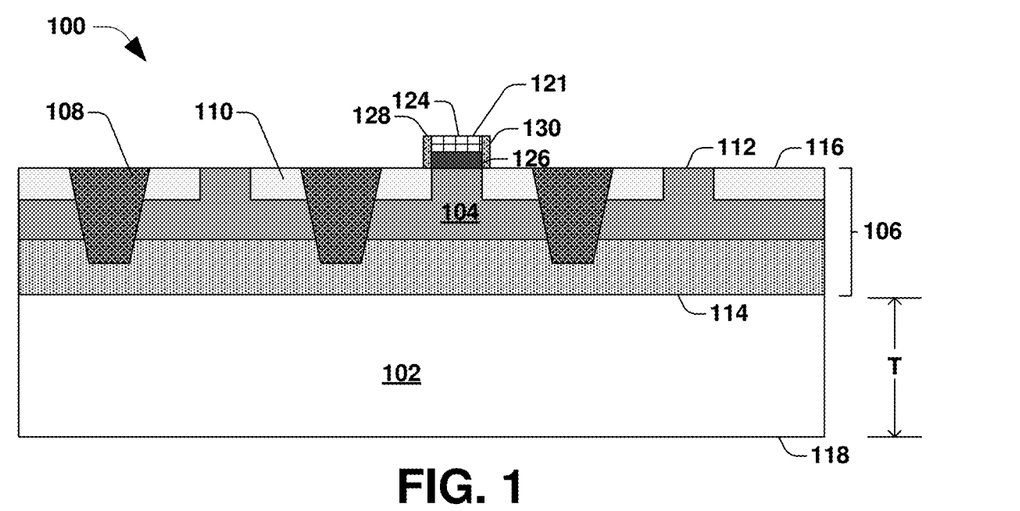
FIGS. 1-6, 7A, and 7B are illustrations of a semiconductor arrangement at various stages of fabrication, according to some embodiments.

Turning to FIG. 1, at least some of a semiconductor arrangement 100 is formed in a substrate 102. In some embodiments, the substrate 102 comprises at least one of a wafer, a die formed from a wafer, an epitaxial layer, a silicon-on-insulator (SOI) structure, or other suitable structure. In some embodiments, the substrate 102 comprises at least one of silicon, germanium, carbide, gallium, arsenide, germanium, arsenic, indium, oxide, sapphire, or other suitable materials. In some embodiments, the substrate 102 is at least one of a p-type substrate (P-substrate) or an n-type substrate (N-substrate). In some embodiments, the substrate 102 comprises at least one of a doped epitaxial layer, a gradient semiconductor layer, or a plurality of semiconductor layers where one or more of the semiconductor layers are of a different type than another layer of the plurality of semiconductor layers. The substrate 102 has a thickness "T" below a device layer 106.

According to some embodiments, doped region(s) 104 are formed in the device layer 106 of the substrate 102. The doped region(s) 104 may be formed by at least one of ion implantation, molecular diffusion, or other suitable techniques. According to some embodiments, a number or amount of dopants implanted into the substrate 102 is controlled, such as to control a concentration of dopants in the doped region(s) 104. According to some embodiments, an energy of dopants implanted into the substrate 102 is controlled, such as to control a depth to which dopants are implanted into the substrate 102. A depth of dopants in the substrate 102 may be controlled by increasing or decreasing a voltage used to direct the dopants into the substrate 102. The doped region(s) 104 comprise at least one of p-type dopants or n-type dopants. In some embodiments, at least some of the doped region(s) 104 are well region(s) of the semiconductor arrangement 100.

According to some embodiments, the semiconductor arrangement 100 comprises isolation regions 108 in the substrate 102. The isolation regions 108 comprise a dielectric material. The isolation regions 108 may comprise at least one of oxide, nitride, or other suitable materials. In some embodiments, formation of the isolation regions 108 comprises etching a trench in the substrate 102, depositing one or more dielectric materials to fill the trench, and planarizing a top surface of the deposited dielectric material(s).

According to some embodiments, the device layer 106 comprises one or more conductive regions 110. At least some of the one or more conductive regions 110 are at least one of over or in the substrate 102 and are at least one of a source region or a drain region of the semiconductor arrangement 100. At least some of the one or more conductive regions 110 comprise dopants implanted into the substrate 102. At least some of the one or more conductive regions 110 comprise an n-type dopant such as at least one of phosphorus (P), arsenic (As), antimony (Sb), at least one Group V element, or other suitable materials, or a p-type dopant such as at least some of boron (B), aluminum (Al), gallium (Ga), indium (In), at least one Group III element, or other suitable materials. At least some of the one or more conductive regions 110 comprise a different dopant type than the dopant type of other regions of the substrate 102 or comprise a dopant concentration greater than a dopant concentration of other regions of the substrate 102. At least some of the one or more conductive regions 110 comprise a dopant concentration less than a dopant concentration of other dopants of the substrate 102. In some embodiments, at least some of the one or more conductive regions 110 comprise fin structures and/or comprise epitaxy structures. In some embodiments, at least some of the one or more conductive regions 110 comprise at least one of silicon (Si), silicon phosphorus (SiP), silicon carbide phosphorus (SiCP), gallium antimony (GaSb), germanium (Ge), germanium tin (GeSn), or silicon germanium (SiGe). Other configurations or materials of the one or more conductive regions 110 are within the scope of the present disclosure.

The device layer 106 has an upper surface 112 over the doped region(s) 104 and a lower surface 114 under the doped region(s) 104 and opposite the upper surface 112. The substrate 102 has an upper surface 116 over the doped region(s) 104 and a lower surface 118 opposite the upper surface 116. In some embodiments, the upper surface 112 of the device layer 106 coincides with, or is the same surface as, the upper surface 116 of the substrate 102. Other configurations of the substrate 102, the doped region(s) 104, the isolation regions 108, or the one or more conductive regions 110 are within the scope of the present disclosure.

The semiconductor arrangement 100 comprises a gate structure 121. The gate structure 121 may be formed before or after formation of the one or more conductive regions 110. The gate structure 121 may comprise at least one of a gate electrode 124, a dielectric region 126, a first sidewall spacer 128, or a second sidewall spacer 130. The gate electrode 124 may comprise a conductive material such as at least one of polysilicon, metal, or other suitable material. According to some embodiments, the gate electrode 124 is doped with one or more dopants. At least one of the dielectric region 126, the first sidewall spacer 128, or the second sidewall spacer 130 comprises a dielectric material such as at least one of oxide, nitride, or other suitable material. In some embodiments, the first sidewall spacer 128 or the second sidewall spacer 130 comprises one or more layers, including silicon nitride, silicon oxynitride, silicon oxide, or other dielectric materials. Formation methods of the gate structure 121 include plasma enhanced chemical vapor deposition (PECVD), low-pressure chemical vapor deposition (LPCVD), sub-atmospheric chemical vapor deposition (SACVD), or other deposition methods.

Figure 2:
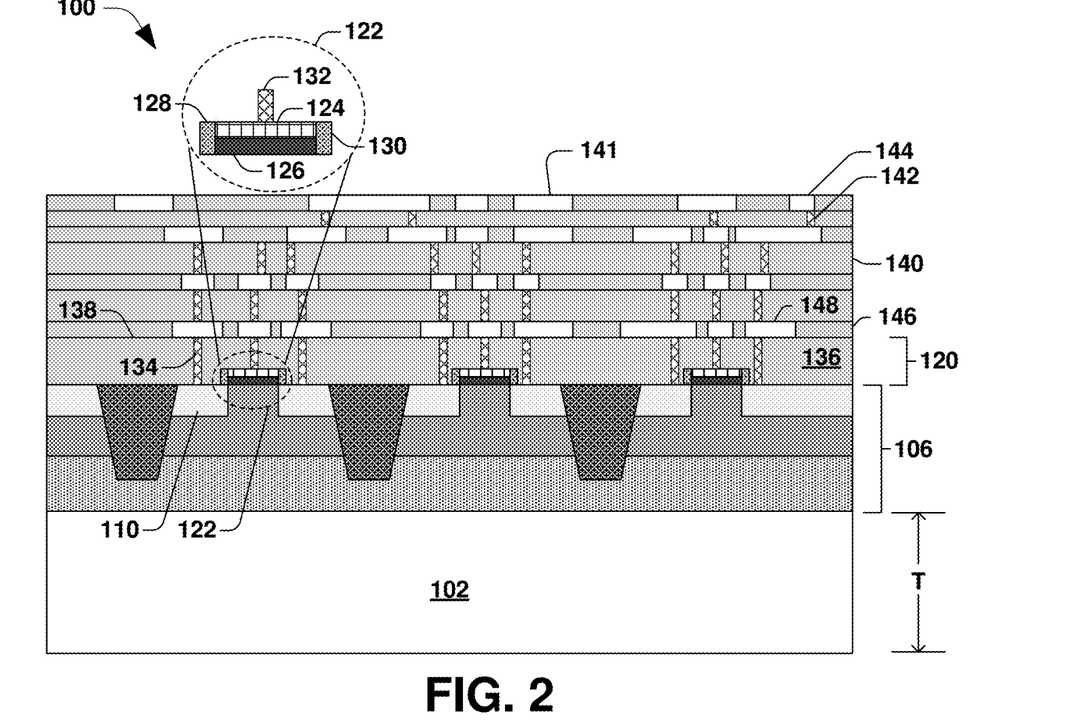

Referring to FIG. 2, according to some embodiments, the semiconductor arrangement 100 comprises a device interconnect layer 120 over the device layer 106. According to some embodiments, the device interconnect layer 120 comprises a gate stack 122. The gate stack 122 may comprise at least one of a gate contact 132, the gate electrode 124, the dielectric region 126, the first sidewall spacer 128, or the second sidewall spacer 130. According to some embodiments, the gate contact 132 is electrically coupled to the gate electrode 124. Other contacts of the device interconnect layer 120 may also be formed, such as contacts 134 coupled to the one or more conductive regions 110. The gate contact 132 and the contacts 134 may be formed in a first dielectric layer 136 of the device interconnect layer 120. The first dielectric layer 136 comprises an upper surface 138.

The semiconductor arrangement 100 comprises one or more second dielectric layers 140 over the upper surface 138 of the first dielectric layer 136. At least some of the one or more second dielectric layers 140 are interlayer dielectric (ILD) layers comprising at least one of tetraethylorthosilicate (TEOS), borophosphosilicate glass (BPSG), fused silica glass (FSG), phosphosilicate glass (PSG), boron doped silicon glass (BSG), or other suitable materials. At least some of the one or more second dielectric layers 140 are formed by physical vapor deposition (PVD), sputtering, chemical vapor deposition (CVD), LPCVD, atomic layer chemical vapor deposition (ALCVD), ultrahigh vacuum CVD (UHVCVD), reduced pressure CVD (RPCVD), molecular beam epitaxy (MBE), liquid phase epitaxy (LPE), or other suitable techniques. Other configurations and methods of forming the one or more second dielectric layers 140 are within the scope of the present disclosure.

The semiconductor arrangement 100 comprises one or more vertical interconnect accesses (VIAs) 142 formed through at least some of the one or more second dielectric layers 140 and one or more metal layers 144 formed through at least some of the one or more second dielectric layers 140. According to some embodiments, at least some of the one or more metal layers 144 are in electrical communication with at least some of the one or more VIAs 142, and at least some of the one or more VIAs 142 are in electrical communication with one or more conductive regions 110 such that a metal layer of the one or more metal layers 144 and a VIA of the one or more VIAs 142 provide an electrical pathway through the one or more of the second dielectric layers 140 to a contact of the contacts 134 in the device interconnect layer 120. Other configurations of the one or more metal layers 144 or the one or more VIAs 142 are within the scope of the present disclosure.

In some embodiments, at least some of the one or more metal layers 144 and at least some of the one or more VIAs 142 are formed by at least one of lithography, etching, PVD, sputtering, CVD, LPCVD, ALCVD, UHVCVD, RPCVD, MBE, LPE, a dual damascene process, or other suitable techniques. In lithography, a light sensitive material such as a photoresist is formed over a layer to be patterned, such as a first metal layer 146. Properties, such as solubility, of the photoresist are affected by the light. The photoresist is either a negative photoresist or a positive photoresist. With respect to the negative photoresist, regions of the negative photoresist become insoluble when illuminated by a light source, such that application of a solvent to the negative photoresist during a subsequent development stage removes non-illuminated regions of the negative photoresist. A pattern formed in the negative photoresist is thus a negative of a pattern defined by opaque regions of a template between the light source and the negative photoresist. In the positive photoresist, illuminated regions of the positive photoresist become soluble and are removed VIA application of the solvent during development. Thus, a pattern formed in the positive photoresist is a positive image of opaque regions of the template between the light source and the positive photoresist. According to some embodiments, an etchant has a selectivity such that the etchant removes or etches away the layer under the photoresist, such as the first metal layer 146, at a greater rate than the etchant removes or etches away the photoresist. Accordingly, an opening in the photoresist allows the etchant to form a corresponding opening in the layer under the photoresist, and thereby transfer a pattern in the photoresist to the layer under the photoresist. The pattern in the layer under the photoresist is filled with one or more materials to form one or more elements, features, etc., such as a conductor 148 in the first metal layer 146, and the patterned photoresist is stripped or washed away at least one of before or after the pattern in the layer under the photoresist is filled with the one or more materials. Other methods of forming at least one of the one or more metal layers 144 or one or more VIAs 142 are within the scope of the present disclosure.

At least one or more of the one or more metal layers 144 or one or more VIAs 142 includes at least one of copper (Cu), aluminum (Al), tin (Sn), nickel (Ni), gold (Au), silver (Ag), tungsten (W), or other suitable materials. In some embodiments, at least one or more of the one or more metal layers 144 or one or more VIAs 142 does not include metal. At least some of the one or more metal layers 144 have a same width or different widths. At least some of the one or more metal layers 144 have a same height or different heights. At least some of the one or more VIAs 142 have a same width or different widths. At least some of the one or more VIAs 142 have a same height or different heights. Other materials or configurations of the one or more metal layers 144 or the one or more VIAs 142 are within the scope of the present disclosure.

According to some embodiments, a width of at least some of the one or more metal layers 144 is different than a width of at least some of the one or more VIAs 142. A width of at least some of the one or more metal layers 144 is the same as a width of at least some of the one or more VIAs 142. A height of at least some of the one or more metal layers 144 is different than a height of at least some of the one or more VIAs 142. A height of at least some of the one or more metal layers 144 is the same as a height of at least some of the one or more VIAs 142. Other materials or configurations of the one or more metal layers 144 or one or more VIAs 142 are within the scope of the present disclosure.

According to some embodiments, the one or more second dielectric layers 140, the one or more VIAs 142, and the one or more metal layers 144 comprise an interconnect arrangement 141 of the semiconductor arrangement 100.

Figure 3:
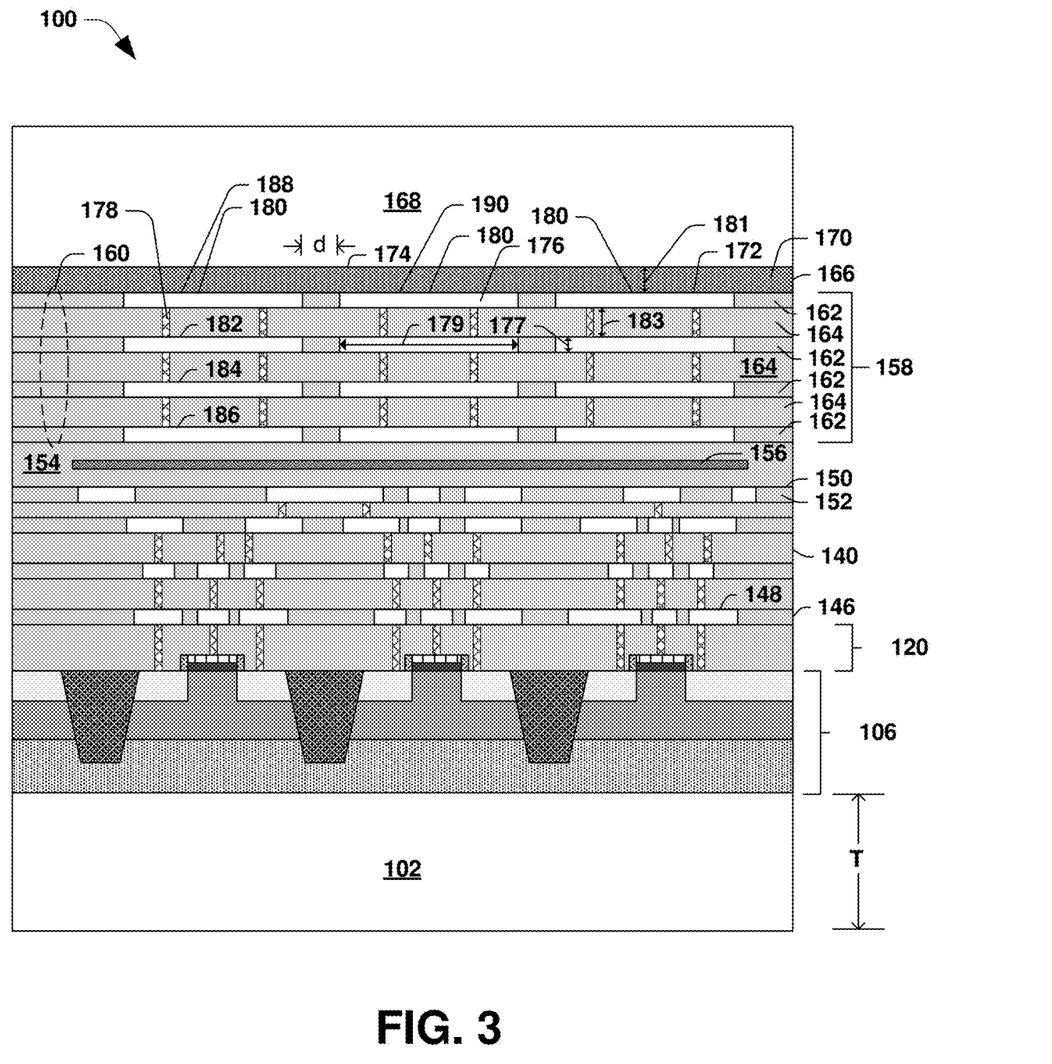

Referring to FIG. 3, a component layer 154 over an upper surface 150 of an uppermost second dielectric layer 152 of the one or more second dielectric layers 140 comprises a heat source 156. The component layer 154 may comprise a dielectric material such as described above with reference to the materials of the one or more second dielectric layers 140, or other suitable materials. The component layer 154 may be formed by way of one or more of the formation techniques described above with reference to the formation of the one or more second dielectric layers 140, or other suitable formation techniques. The heat source 156 may be formed in the component layer 154 by way of one or more of the formation techniques described above with reference to the formation of the one or more metal layers 144 or the one or more VIAs 142, or other suitable formation techniques. According to some embodiments, the heat source 156 may comprise a heat generating element such as a resistor when conducting current.

The semiconductor arrangement 100 comprises a first heat conductor 158 formed over the component layer 154. The first heat conductor 158 may comprise dielectric layers 160, dummy metal layers 162, and dummy VIA layers 164. The dummy metal layers 162 may comprise dummy conductors 176. The dummy VIA layers 164 may comprise dummy VIAs 178. The dielectric layers 160 may be formed of one or more of the materials such as described above with reference to the materials of the one or more second dielectric layers 140, or other suitable materials. The dummy metal layers 162 and the dummy VIA layers 164 may be formed over the component layer 154 by way of one or more of the formation techniques described above with reference to the formation of the one or more metal layers 144 or the one or more VIAs 142, or other suitable formation techniques. In some embodiments, a concentration density of dummy VIAs 178 in a dummy VIA layer 164 is at least two percent to provide a sufficient or an ample amount of dissipation of heat emanating from the heat source 156. In some embodiments, a shape of the dummy VIAs 178 is square, tapered, slot-like, or other suitable shape. In some embodiments, the dummy conductors 176 have a thickness 177 and a length 179 that are compatible with thicknesses and lengths of conductors in other metal layers, such as those of conductor 148 in first metal layer 146. For example, the thickness 177 may be 0.05 to 0.1 micrometers and the length 179 may be at least one micrometer.

The semiconductor arrangement 100 comprises a bonding layer 166 overlying the first heat conductor 158. The bonding layer 166 may comprise a thermally conductive material 170 suitable as a bonding material and as a heat transfer material to transfer heat from the first heat conductor 158 to a heat sink 168 overlying the bonding layer 166.

According to some embodiments, the thermally conductive material 170 comprises aluminum (Al), aluminum nitride (AlN), or other bonding material suitable for bonding and for heat transfer. The material is applied to an upper surface 172 of the first heat conductor 158 by at least one of thermal oxidation, PVD, sputtering, CVD, LPCVD, ALCVD, UHVCVD, RPCVD, MBE, LPE, spin coating, oxidation, a passivation process, or other suitable techniques. When applied to the first heat conductor 158, the thermally conductive material 170 adheres to at least a portion of the upper surface 172 of the first heat conductor 158. According to some embodiments, the thermally conductive material 170 is applied to a thickness 181 within a range of 2-50 kilo-angstroms (kA). In some embodiments, a thickness of less than 2 kA may not provide a specified adhesion strength or desired adhesion strength between the first heat conductor 158 and the heat sink 168. A thickness of more than 2 kA may inhibit or reduce heat transfer from the first heat conductor 158 to the heat sink 168.

A bonding process for bonding the heat sink 168 to the first heat conductor 158 includes at least one or more of adhesive bonding, surface activated bonding, plasma activated bonding, anodic bonding, eutectic bonding, glass frit bonding, thermocompression bonding, reactive bonding, transient liquid phase diffusion bonding, or other suitable bonding processes. According to some embodiments, the bonding process includes conditioning at least one of the upper surface 172 of the first heat conductor 158 or a lower surface 174 of the heat sink 168. Conditioning the upper surface 172 of the first heat conductor 158 or the lower surface 174 of the heat sink 168 includes one or more of cleaning, flattening, physical buffering, chemical buffering, or other suitable surface conditioning processes. The bonding process includes conditioning a bonding environment by one or more of regulating a bonding temperature, regulating an applied bonding force, regulating an ambient pressure, or regulating other bonding environment conditions. Other bonding processes are within the scope of the present disclosure.

The heat sink 168 may comprise a carrier wafer of the semiconductor arrangement 100. The heat sink 168 may comprise at least one of an epitaxial layer, a SOI structure, or a die. The heat sink 168 may comprise at least one of silicon, germanium, carbide, gallium, arsenide, germanium, arsenic, indium, oxide, sapphire, or other suitable materials. Other configurations or compositions of the heat sink 168 are within the scope of the present disclosure.

The first heat conductor 158 may comprise a dummy interconnect structure 180 comprising dummy conductors 176 and dummy VIAs 178. According to some embodiments, the first heat conductor 158 comprises two or more dummy interconnect structures 180. A dummy interconnect structure 180 of the dummy interconnect structures comprises dummy metal layers 162. According to some embodiments, the dummy interconnect structure 180 comprises three dummy metal layers 162. According to some embodiments, the dummy interconnect structure 180 comprises dummy conductors 176. Two or more dummy conductors 176 of a dummy interconnect structure 180 may be a same length 179. According to some embodiments, the dummy interconnect structure 180 comprises dummy VIAs 178. Two or more dummy VIAs 178 of a dummy interconnect structure 180 may be a same height 183. A dummy interconnect structure 180 of the dummy interconnect structures may comprise dummy VIAs 178 in parallel. A dummy interconnect structure 180 of the dummy interconnect structures may comprise a dummy ladder formation having two or more dummy conductors arranged in parallel. A first "rung" 182 of the dummy ladder formation may be over a second "rung" 184, and the second "rung" 184 of the dummy ladder formation may be over a third "rung" 186. The first "rung" 182 may be coupled to the second "rung" 184 by at least one dummy VIA 178, and the second "rung" 184 of the dummy ladder formation may be coupled to the third "rung" 186 by at least another dummy VIA 178. According to some embodiments, the first heat conductor 158 comprises two or more dummy ladder formations in parallel, which may be referred to as a multi-ladder dummy interconnect structure. In some embodiments, a first dummy ladder formation 188 is separated from a second dummy ladder formation 190 by at least a distance "d."

Figure 4:
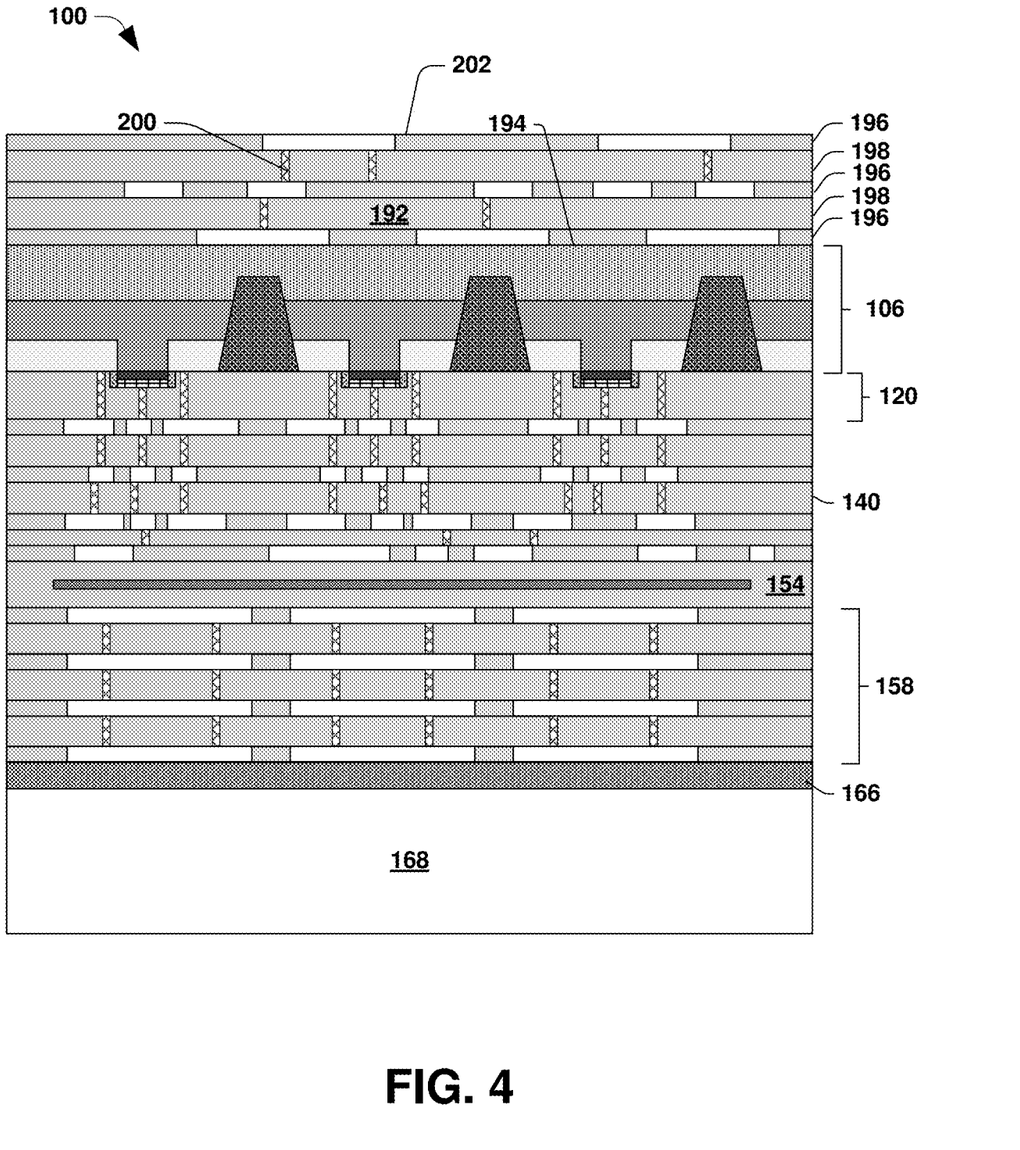

FIG. 4 illustrates the semiconductor arrangement 100 rotated 180° with respect to the orientation of the semiconductor arrangement 100 as illustrated in FIG. 3. In FIG. 4, the device layer 106 is over the component layer 154.

Referring to FIG. 4, at least a portion of the thickness "T" of the substrate 102 (illustrated in FIG. 3) below the device layer 106 is reduced by removing at least a portion of the substrate 102. A portion of the substrate 102 may be removed by at least one or more of wafer back-grinding, liquid etching, dry etching, plasma etching, chemical-mechanical polishing, planarization, or other suitable processes. The thickness of the removed portion of the substrate 102 may be "T" or less. FIG. 4 illustrates that the thickness of the substrate has been reduced by "T".

The semiconductor arrangement 100 comprises one or more third dielectric layers 192 over an upper surface 194 of the device layer 106 after the semiconductor arrangement 100 is rotated 180°. At least some of the one or more third dielectric layers 192 are ILD layers comprising at least one of TEOS, BPSG, FSG, PSG, BSG, or other suitable materials. At least some of the one or more third dielectric layers 192 are formed by PVD, sputtering, CVD, LPCVD, ALCVD, UHVCVD, RPCVD, MBE, LPE, or other suitable techniques. Other configurations and methods of forming the one or more third dielectric layers 192 are within the scope of the present disclosure.

Some of the one or more third dielectric layers 192 are metal layers 196 and some of the one or more third dielectric layers 192 are VIA layers 198 comprising one or more VIAs 200. The metal layers 196 and the one or more VIAs 200 may be formed by way of one or more of the formation techniques described above with reference to the formation of the one or more metal layers 144 or the one or more VIAs 142, or other suitable formation techniques. The one or more third dielectric layers 192 comprise an uppermost surface 202.

Figure 5:
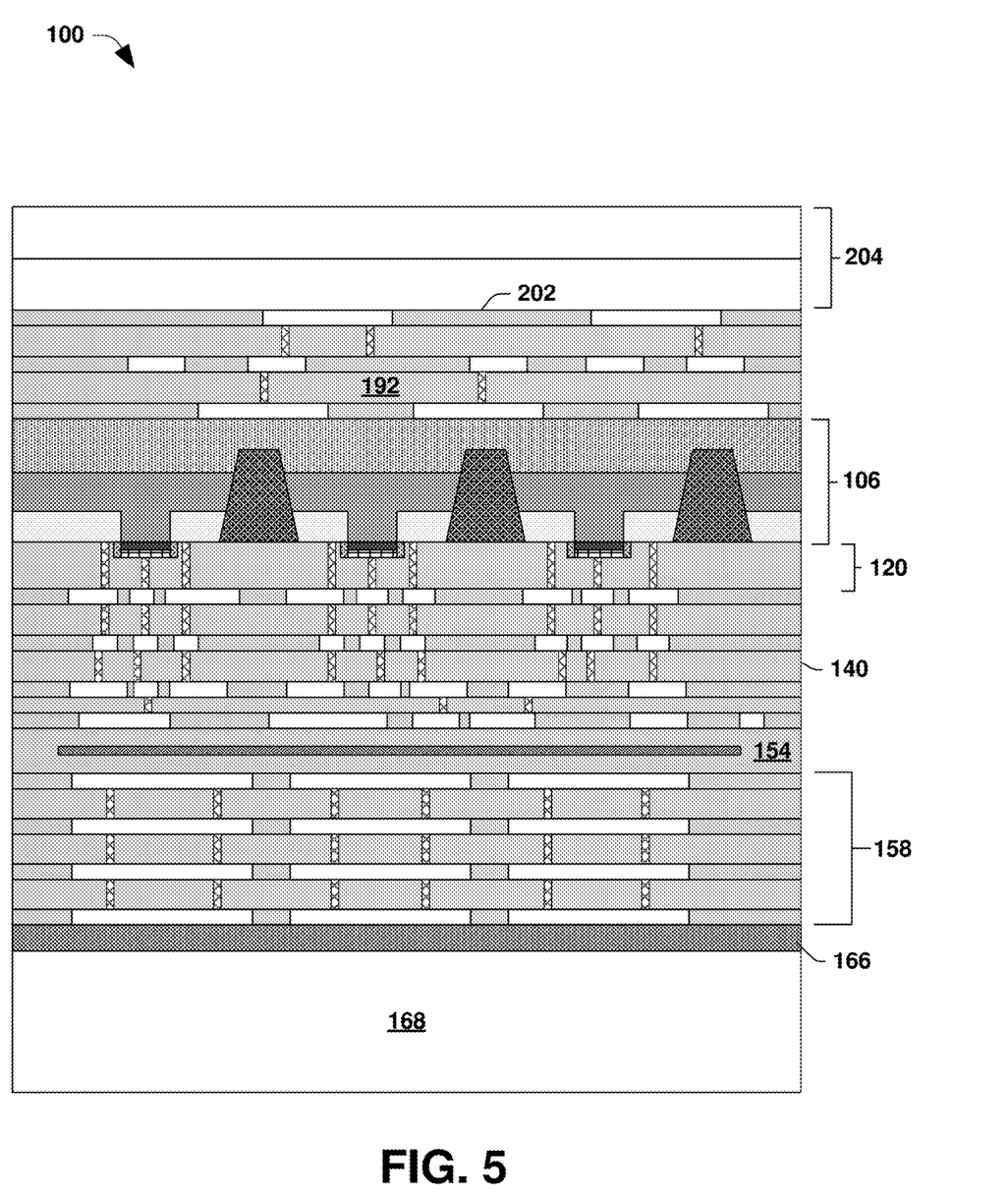

Referring to FIG. 5, in some embodiments the semiconductor arrangement 100 comprises one or more fourth dielectric layers 204 over the uppermost surface 202 of the one or more third dielectric layers 192. The one or more fourth dielectric layers 204 may comprise components and/ or input/output pads. For example, a first dielectric layer of the one or more fourth dielectric layers 204 may comprise an inductor and a second dielectric layer of the one or more fourth dielectric layers 204 may comprise an input/output pad, a power source pad, and a ground pad. Other configurations of the one or more fourth dielectric layers 204 are within the scope of the present disclosure.

Figure 6:
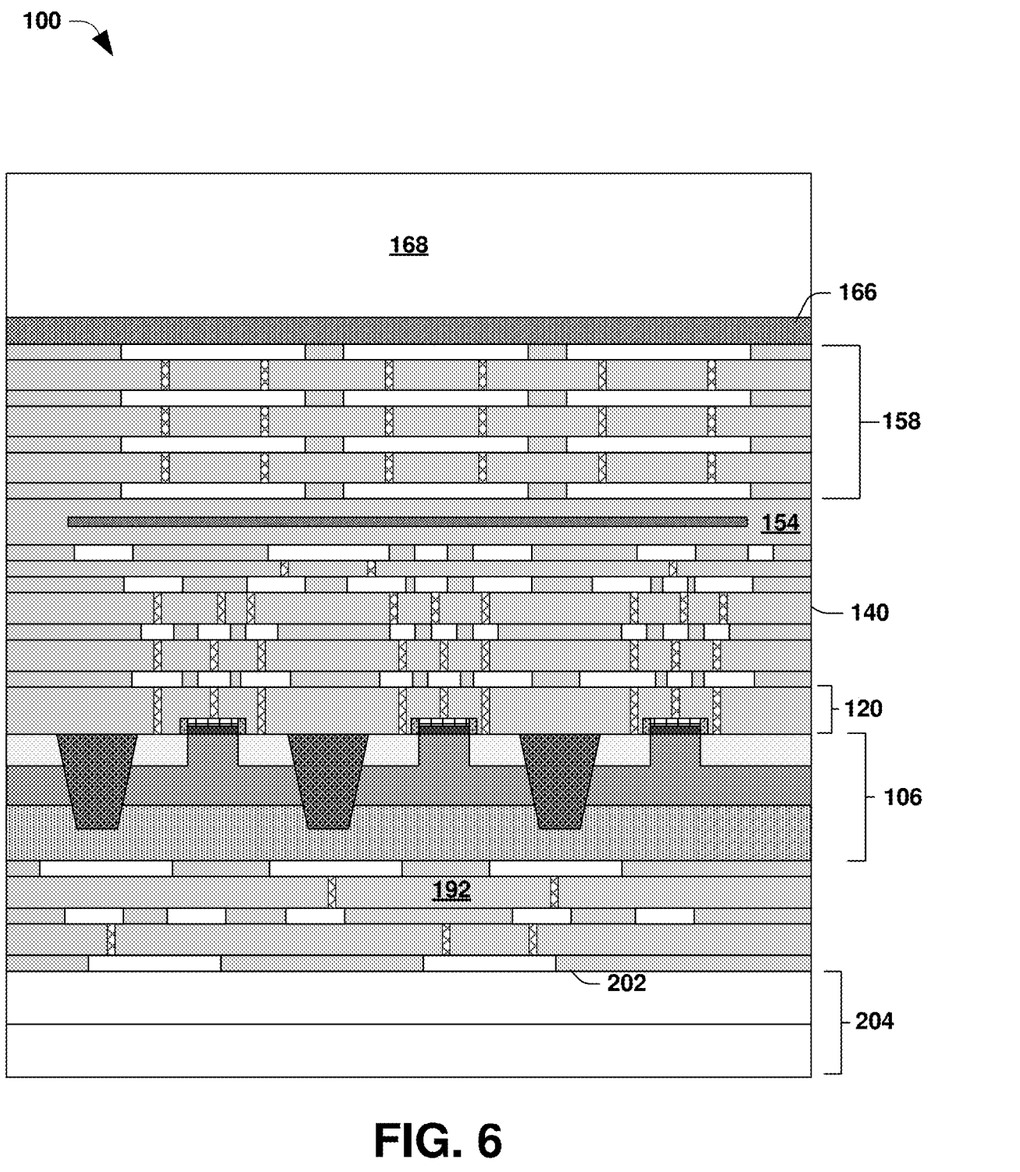

For clarity of presentation, FIG. 6 illustrates the semiconductor arrangement 100 of FIG. 5 rotated 180° with respect to the orientation of the semiconductor arrangement 100 as illustrated in FIG. 5. In FIG. 6, the component layer 154 is over the device layer 106. The numerical reference numbering in FIG. 6 is the same as the numerical reference numbering in FIG. 5.

Figure 7A:
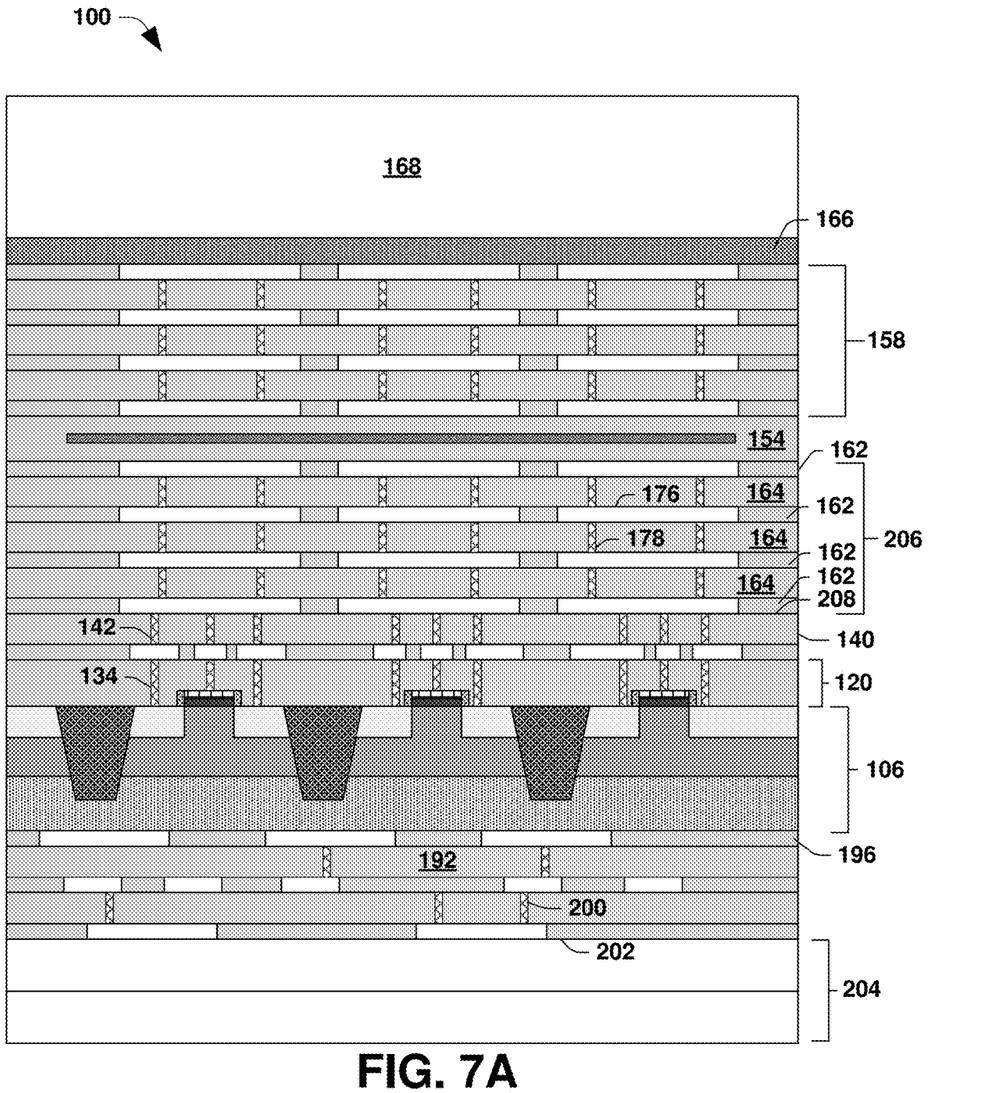

Referring to FIG. 7A, in some embodiments the semiconductor arrangement 100 comprises a second heat conductor 206 over an upper surface 208 of the one or more second dielectric layers 140. The second heat conductor 206 comprises dummy metal layers 162, dummy VIA layers 164, dummy conductors 176, and dummy VIAs 178. The second heat conductor 206 may be formed by way of one or more of the formation techniques described above with reference to the formation of the first heat conductor 158, or other suitable formation techniques.

In some alternative embodiments, the semiconductor arrangement 100 may include more interconnect structures beside the first heat conductor 158. Such interconnect structures may formed together with the first heat conductor 158 in same processes and layers, comprising conductors and VIAs, and electrically connected to the underlying interconnect arrangement 141.

Figure 7B:
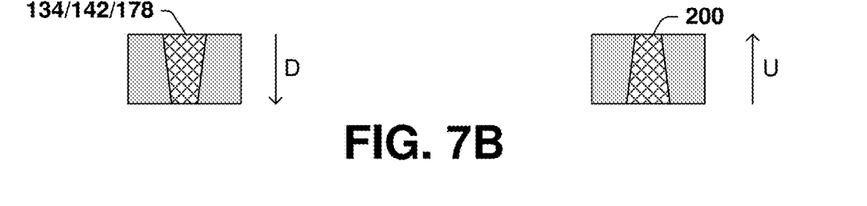

Referring to FIG. 7B, a shape of one or more of the contacts 134, the one or more VIAs 142, or the dummy VIAs 178 may be tapered, such as narrowing, in a downward direction D. A shape of the one or more VIAs 200 may be tapered, such as narrowing, in an upward direction U, which is opposite to the downward direction D. According to some embodiments, the opposite tapering directions may be a result of one or more types of formation techniques. For example, the opposite tapering directions D and U may be the result of a double-sided process wherein the contacts 134, the one or more VIAs 142, and the dummy VIAs 178 are formed with the semiconductor arrangement 100 in a first orientation (e.g., such as is shown in FIGS. 2 and 3) and the one or more VIAs 200 are formed with the semiconductor arrangement 100 in a second orientation. The second orientation may be a 180° rotation (e.g., such as is illustrated in FIG. 4) of the first orientation.

Figure 8:
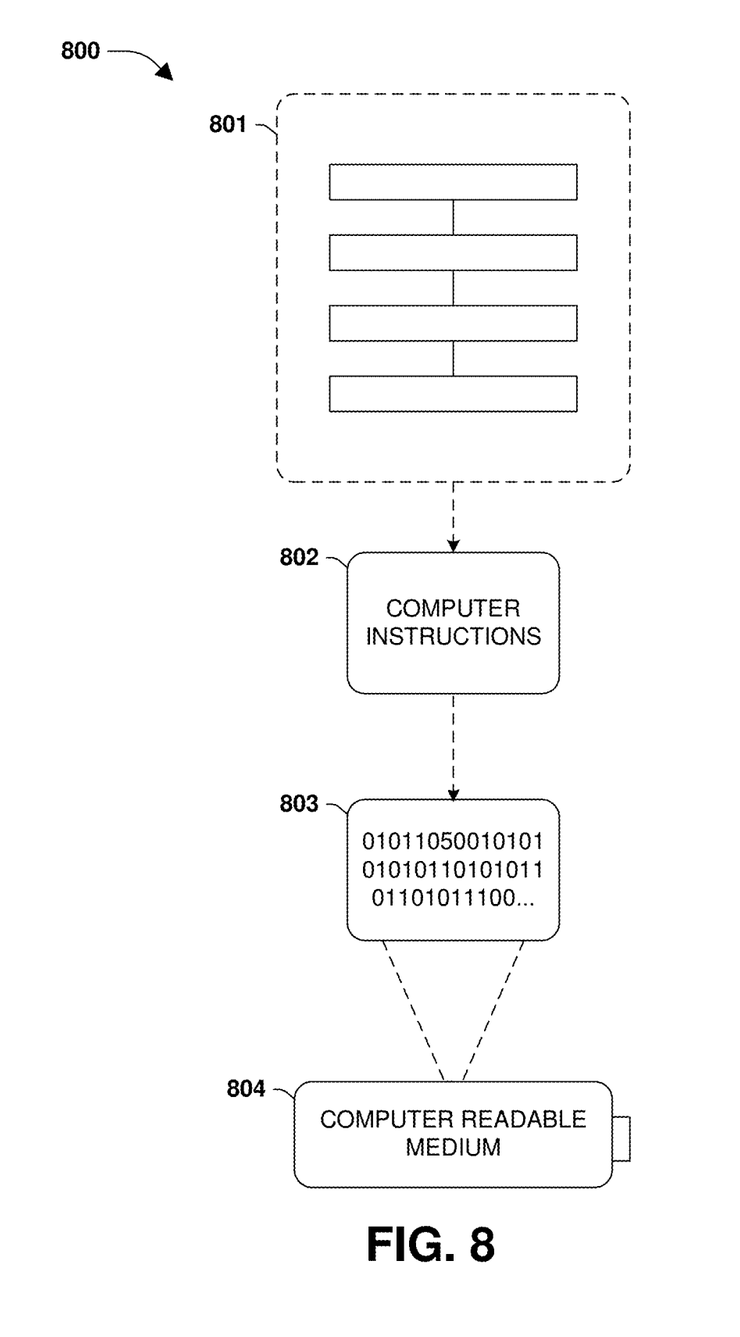
FIG. 8 illustrates an exemplary computer-readable medium, according to some embodiments.

FIG. 8 illustrates an exemplary computer-readable medium, according to some embodiments. One or more embodiments involve a computer-readable medium comprising processor-executable instructions configured to implement one or more of the techniques presented herein. An exemplary computer-readable medium is illustrated in FIG. 8, wherein the embodiment 800 comprises a computer-readable medium 804 (e.g., a CD-R, DVD-R, flash drive, a platter of a hard disk drive, etc.), on which is encoded computer-readable data 803. This computer-readable data 803 in turn comprises a set of processor-executable computer instructions 802 that when executed are configured to facilitate operations according to one or more of the principles set forth herein. In some embodiments 800, the processor-executable computer instructions 802, when executed, are configured to facilitate performance of a method 801, such as at least some of the aforementioned method(s). In some embodiments, the processor-executable computer instructions 802, when executed, are configured to facilitate implementation of a system, such as at least some of the one or more aforementioned system(s). Many such computer-readable media may be devised by those of ordinary skill in the art that are configured to operate in accordance with the techniques presented herein.

Figure 9:
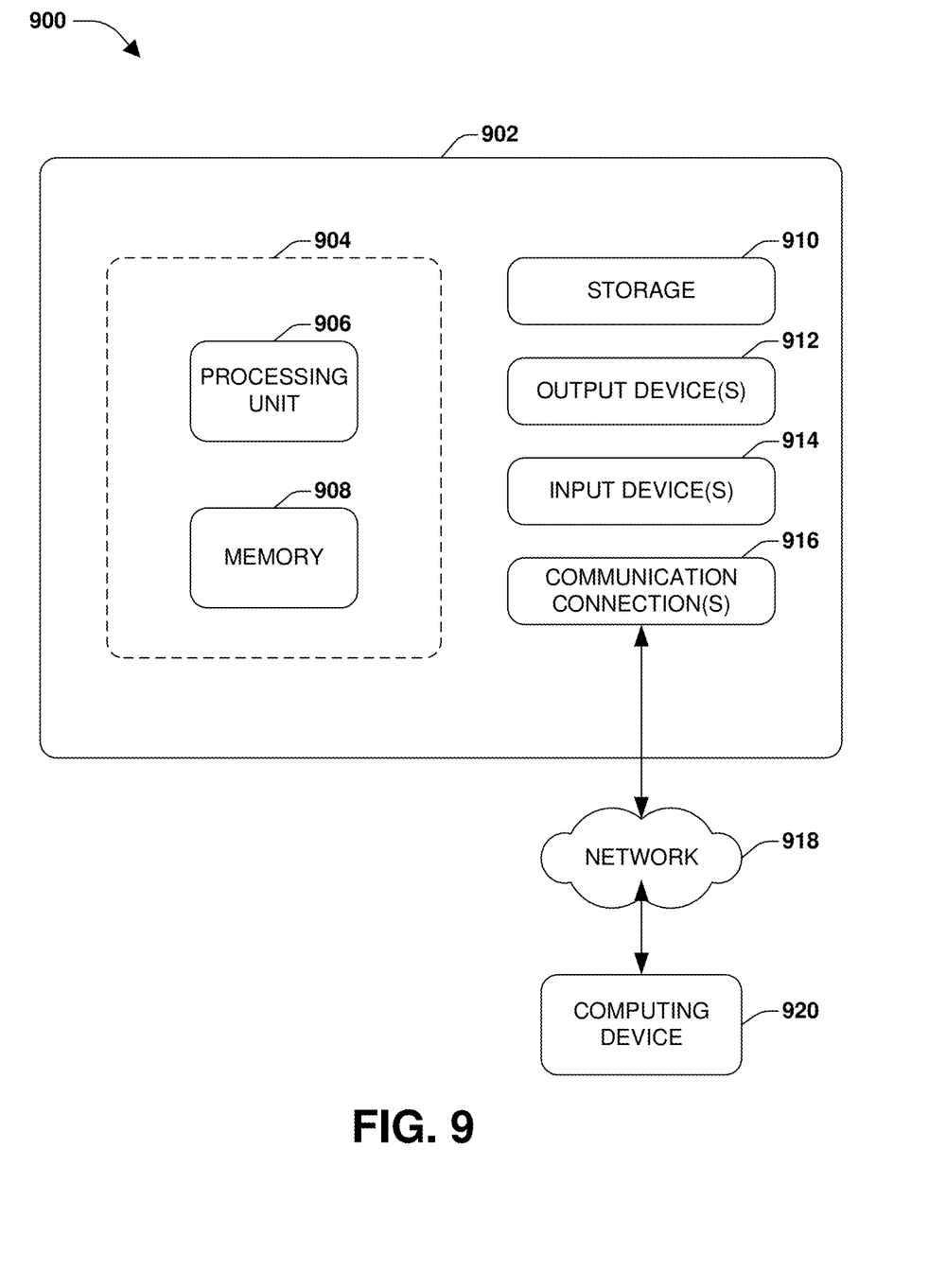
FIG. 9 illustrates an example computing environment wherein one or more of the provisions set forth herein may be implemented, according to some embodiments.

FIG. 9 illustrates an example computing environment wherein one or more of the provisions set forth herein may be implemented, according to some embodiments. FIG. 9 and the following discussion provide a brief, general description of a suitable computing environment to implement embodiments of one or more of the provisions set forth herein. The computing environment of FIG. 9 is only one example of a suitable computing environment and is not intended to suggest any limitation as to the scope of use or functionality of the computing environment. Example computing devices include, but are not limited to, personal computers, server computers, hand-held or laptop devices, mobile devices (such as mobile phones, Personal Digital Assistants (PDAs), media players, and the like), multiprocessor systems, consumer electronics, mini computers, mainframe computers, distributed computing environments that include any of the above systems or devices, and the like.

Although not required, embodiments are described in the general context of "computer readable instructions" being executed by one or more computing devices. Computer readable instructions may be distributed VIA computer readable media (discussed below). Computer readable instructions may be implemented as program modules, such as functions, objects, Application Programming Interfaces (APIs), data structures, and the like, that perform particular tasks or implement particular abstract data types. Typically, the functionality of the computer readable instructions may be combined or distributed as desired in various environments.

FIG. 9 depicts an example of a system 900 comprising a computing device 902 configured as a controller to implement embodiments provided herein. In some configurations, computing device 902 includes at least one processing unit 906 and memory 908. Depending on the exact configuration and type of computing device, memory 908 may be volatile (such as RAM, for example), non-volatile (such as ROM, flash memory, etc., for example), or some combination of the two. This configuration is illustrated in FIG. 9 by dashed line 904.

In some embodiments, computing device 902 may include additional features and/or functionality. For example, computing device 902 may also include additional storage (e.g., removable and/or non-removable) including, but not limited to, magnetic storage, optical storage, and the like. Such additional storage is illustrated in FIG. 9 by storage 910. In some embodiments, computer readable instructions to implement one or more embodiments provided herein may be in storage 910. Storage 910 may also store other computer readable instructions to implement an operating system, an application program, and the like. Computer readable instructions may be loaded in memory 908 for execution by processing unit 906, for example.

The term "computer readable media" as used herein includes computer storage media. Computer storage media includes volatile and nonvolatile, removable and non-removable media implemented in any method or technology for storage of information such as computer readable instructions or other data. Memory 908 and storage 910 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by computing device 902. Any such computer storage media may be part of computing device 902.

Computing device 902 may also include communication connection(s) 916 that allows computing device 902 to communicate with other devices. Communication connection(s) 916 may include, but is not limited to, a modem, a Network Interface Card (NIC), an integrated network interface, a radio frequency transmitter/receiver, an infrared port, a USB connection, or other interfaces for connecting computing device 902 to other computing devices. Communication connection(s) 916 may include a wired connection or a wireless connection. Communication connection(s) 916 may transmit and/or receive communication media.

The term "computer readable media" may include communication media. Communication media typically embodies computer readable instructions or other data in a "modulated data signal" such as a carrier wafer or other transport mechanism and includes any information delivery media. The term "modulated data signal" may include a signal that has one or more of its characteristics set or changed in such a manner as to encode information in the signal.

Computing device 902 may include input device(s) 914 such as keyboard, mouse, pen, voice input device, touch input device, infrared cameras, video input devices, and/or any other input device. Output device(s) 912 such as one or more displays, speakers, printers, and/or any other output device may also be included in computing device 902. Input device(s) 914 and output device(s) 912 may be connected to computing device 902 VIA a wired connection, wireless connection, or any combination thereof. In some embodiments, an input device or an output device from another computing device may be used as input device(s) 914 or output device(s) 912 for computing device 902.

Components of computing device 902 may be connected by various interconnects, such as a bus. Such interconnects may include a Peripheral Component Interconnect (PCI), such as PCI Express, a Universal Serial Bus (USB), firewire (IEEE 1394), an optical bus structure, and the like. In some embodiments, components of computing device 902 may be interconnected by a network. For example, memory 908 may be comprised of multiple physical memory units located in different physical locations interconnected by a network.

Those skilled in the art will realize that storage devices utilized to store computer readable instructions may be distributed across a network. For example, a computing device 920 accessible VIA a network 918 may store computer readable instructions to implement one or more embodiments provided herein. Computing device 902 may access computing device 920 and download a part or all of the computer readable instructions for execution. Alternatively, computing device 902 may download pieces of the computer readable instructions, as needed, or some instructions may be executed at computing device 902 and some at computing device 920.

The disclosed semiconductor arrangement 100 comprises the first heat conductor 158 coupled to the heat sink 168 by the thermally conductive material 170 of the bonding layer 166. The component layer 154 comprises a heat source 156 and is below the first heat conductor 158. The interconnect arrangement 141 is below the heat source and comprises the metal layers 144 and the VIAs 142. Heat from the heat source 156 conducts in the direction of the heat sink 168 by way of the first heat conductor 158 and the thermally conductive material 170. Because the heat sink 168 is above the heat source 156 and the interconnect arrangement 141 is below the heat source 156, the first heat conductor 158 conducts heat away from the interconnect arrangement 141 and toward the heat sink 168. Because heat is conducted away from the interconnect arrangement 141, the interconnect arrangement 141 is exposed to less heat than interconnect arrangements are exposed to in semiconductor arrangements that do not include a heat conductor over the heat source, a thermally conductive material of a bonding layer over the heat conductor, and a heat sink over the thermally conductive material of a bonding layer. Because the interconnect arrangement 141 is exposed to less heat, the metal layers 144 and VIAs 142 of the interconnect arrangement 141 are less likely to suffer heat damage due to heat dissipated by the heat source 156.

The disclosed semiconductor arrangement 100 may comprise a second heat conductor 206 below the heat source 156 and over the interconnect arrangement 141 to dissipate heat between the heat source 156 and the interconnect arrangement 141.

The first heat conductor 158 and/or the second heat conductor 206 comprise dummy metal layers 162 coupled to one another by dummy VIA layers 164. Because the first heat conductor 158 and/or the second heat conductor 206 comprise dummy metal layers 162 and dummy VIA layers 164, the first heat conductor 158 may be formed using interconnect formation techniques that are similar to or the same as interconnect formation techniques used to form metal layers and VIAs of an interconnect arrangement coupled to a device layer, such as device layer 106.

According to some embodiments, a semiconductor arrangement includes a device layer within a substrate, a first metal layer over the device layer, a heat source over the first metal layer, and a first heat conductor over the heat source. The first heat conductor includes a first dummy metal layer, a first dummy VIA layer over the first dummy metal layer, and a second dummy metal layer over the first dummy VIA layer.

According to some embodiments, a method of forming a semiconductor arrangement includes forming a device layer in a substrate, forming a first metal layer over the device layer, forming a second metal layer under the device layer, forming a first heat conductor over the first metal layer. Forming the first heat conductor includes forming a first dummy metal layer over the first metal layer, forming a first dummy VIA layer over the first dummy metal layer, and forming a second dummy metal layer over the first dummy VIA layer.

According to some embodiments, a semiconductor device includes a heat source, a bonding layer, a first heat conductor overlying the heat source and underlying the bonding layer, and a heat sink overlying the bonding layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally to be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor arrangement, comprising:
   a device layer within a substrate;
   a first metal layer over the device layer;
   a heat source over the first metal layer; and
   a first heat conductor over the heat source, wherein the first heat conductor comprises:
      a first dummy metal layer;
      a first dummy vertical interconnect access (VIA) layer over the first dummy metal layer; and
      a second dummy metal layer over the first dummy VIA layer.

2. The semiconductor arrangement of claim 1, wherein the heat source is a resistor.

3. The semiconductor arrangement of claim 1, comprising:
   a heat sink over the second dummy metal layer; and
   a bonding layer overlying the second dummy metal layer and underlying the heat sink.

4. The semiconductor arrangement of claim 3, wherein the bonding layer comprises aluminum nitride (AlN).

5. The semiconductor arrangement of claim 3, wherein the bonding layer is adhered to the heat sink and to the second dummy metal layer.

6. The semiconductor arrangement of claim 3, wherein the heat sink comprises a carrier layer comprising silicon.

7. The semiconductor arrangement of claim 1, wherein the first heat conductor comprises:
   a third dummy metal layer overlying the first dummy VIA layer, and
   a second dummy VIA layer underlying the second dummy metal layer and overlying the third dummy metal layer.

8. The semiconductor arrangement of claim 1, wherein:
   the first dummy VIA layer comprises dummy VIAs, and
   a concentration density of the dummy VIAs in the first dummy VIA layer is at least two percent.

9. The semiconductor arrangement of claim 1, comprising a second metal layer underlying the device layer.

10. The semiconductor arrangement of claim 1, comprising a second heat conductor underlying the heat source, wherein the second heat conductor comprises:
    a third dummy metal layer;
    a second dummy VIA layer underlying the third dummy metal layer; and
    a fourth dummy metal layer underlying the second dummy VIA layer.

11. A semiconductor device, comprising:
    a heat source;
    a bonding layer;
    a first heat conductor overlying the heat source and underlying the bonding layer; and
    a heat sink overlying the bonding layer.

12. The semiconductor device of claim 11, wherein the heat source is a resistor.

13. The semiconductor device of claim 11, wherein the bonding layer comprises aluminum nitride.

14. The semiconductor device of claim 11, wherein the first heat conductor comprises:
    dummy vertical interconnect access (VIA) layers; and
    three dummy metal layers coupled to the dummy VIA layers, wherein the dummy VIA layers and the three dummy metal layers comprise a multi-ladder dummy interconnect structure.

15. The semiconductor device of claim 11, comprising:
    a device interconnect layer underlying the heat source;
    a device layer underlying the device interconnect layer; and
    metal layers underlying the device layer.

16. A semiconductor arrangement, comprising:
    a via layer;
    a substrate over the via layer;
    a heat source over the substrate;
    a heat conductor overlying the heat source; and
    a heat sink over the heat conductor.

17. The semiconductor arrangement of claim 16, comprising:
    a metal layer between the via layer and the substrate.

18. The semiconductor arrangement of claim 16, comprising:
    a dielectric layer, wherein the via layer is between the dielectric layer and the substrate.

19. The semiconductor arrangement of claim 16, comprising:
    a bonding layer between the heat conductor and the heat sink.

20. The semiconductor arrangement of claim 16, wherein the heat sink comprises a carrier layer comprising silicon.

* * * * *